(12) United States Patent
Yamamoto et al.

(10) Patent No.: US 10,964,576 B2
(45) Date of Patent: Mar. 30, 2021

(54) ELECTROSTATIC ATTACHMENT CHUCK, METHOD FOR MANUFACTURING THE SAME, AND SEMICONDUCTOR DEVICE MANUFACTURING METHOD

(71) Applicant: OKAMOTO MACHINE TOOL WORKS, LTD., Gunma (JP)

(72) Inventors: Eiichi Yamamoto, Gunma (JP); Yoshihiro Terakubo, Gunma (JP); Takahiko Mitsui, Gunma (JP); Toshihiro Ito, Gunma (JP)

(73) Assignee: OKAMOTO MACHINE TOOL WORKS, LTD., Gunma (JP)

(*) Notice: Subject to any disclaimer, the term of this patent is extended or adjusted under 35 U.S.C. 154(b) by 337 days.

(21) Appl. No.: 15/960,790

(22) Filed: Apr. 24, 2018

(65) Prior Publication Data

US 2018/0315635 A1    Nov. 1, 2018

(30) Foreign Application Priority Data

Apr. 27, 2017 (JP) .............................. JP2017-088042

(51) Int. Cl.
| | |
|---|---|
| *B24B 41/06* | (2012.01) |
| *H01L 21/683* | (2006.01) |
| *H01L 21/304* | (2006.01) |
| *H01L 21/67* | (2006.01) |
| *H01L 21/687* | (2006.01) |

(52) U.S. Cl.
CPC .......... *H01L 21/6833* (2013.01); *B24B 41/06* (2013.01); *H01L 21/304* (2013.01); *H01L 21/67092* (2013.01); *H01L 21/6835* (2013.01); *H01L 21/68757* (2013.01); *H01L 2221/6834* (2013.01); *H01L 2221/68327* (2013.01)

(58) Field of Classification Search
CPC ... B24B 41/06; B23Q 3/1543; H01L 21/6831; H01L 21/6833; H01L 21/6835; H01L 21/304; H01L 21/67092; H01L 21/68757; H01L 2221/6834; H01L 2221/68327
USPC .......................... 451/449; 269/903, 310, 309
See application file for complete search history.

(56) References Cited

U.S. PATENT DOCUMENTS

| | | | | |
|---|---|---|---|---|
| 4,645,218 A | * | 2/1987 | Ooshio | ............... H01L 21/6831 269/13 |
| 5,103,367 A | * | 4/1992 | Horwitz | .............. H01L 21/6831 269/8 |
| 5,151,845 A | * | 9/1992 | Watanabe | ........... H01L 21/6831 279/128 |
| 5,209,028 A | * | 5/1993 | McDermott | .......... B08B 7/0092 134/7 |
| 5,656,093 A | * | 8/1997 | Burkhart | ............. H01L 21/6831 118/728 |
| 5,699,223 A | * | 12/1997 | Mashiro | .............. H01L 21/6831 361/234 |
| 5,708,250 A | * | 1/1998 | Benjamin | ............... H02N 13/00 219/121.58 |

(Continued)

FOREIGN PATENT DOCUMENTS

JP    2003-282671    10/2003

*Primary Examiner* — George B Nguyen
(74) *Attorney, Agent, or Firm* — Rankin, Hill & Clark LLP

(57) ABSTRACT

An electrostatic attachment chuck includes: a substrate; a synthetic resin sheet joined to one main surface of the substrate; and at least a pair of electrodes disposed in the synthetic resin sheet. The synthetic resin sheet includes a planarized and ground surface serving as a surface on which a semiconductor wafer is abutted.

8 Claims, 4 Drawing Sheets

(56) References Cited

U.S. PATENT DOCUMENTS

| | | | | |
|---|---|---|---|---|
| 6,122,159 | A * | 9/2000 | Arai | H01L 21/6833 361/234 |
| 6,123,606 | A * | 9/2000 | Hill | B24B 1/00 451/178 |
| 6,272,002 | B1 * | 8/2001 | Mogi | H02N 13/00 361/234 |
| 6,351,367 | B1 * | 2/2002 | Mogi | B25B 11/002 279/128 |
| 6,992,876 | B1 * | 1/2006 | Nakajima | H01L 21/67109 118/724 |
| 7,677,955 | B2 * | 3/2010 | Kajiyama | B24B 1/00 451/11 |
| 8,469,342 | B2 * | 6/2013 | Tatsumi | B65G 49/061 269/21 |
| 8,967,608 | B2 * | 3/2015 | Mitsumori | C23C 14/50 269/21 |
| 2005/0090187 | A1 * | 4/2005 | Shih | B24B 37/205 451/6 |
| 2005/0193951 | A1 * | 9/2005 | Furuse | H01J 37/32559 118/728 |
| 2006/0292968 | A1 * | 12/2006 | Fujii | B24B 37/048 451/54 |
| 2009/0142599 | A1 * | 6/2009 | Dekempeneer | C23C 16/26 428/408 |
| 2011/0162526 | A1 * | 7/2011 | Tatsumi | B03C 3/64 96/58 |
| 2013/0095734 | A1 * | 4/2013 | Zaruba | B24B 55/03 451/449 |
| 2013/0115433 | A1 * | 5/2013 | Kurihara | B81C 1/00015 428/202 |
| 2014/0355170 | A1 * | 12/2014 | Wade | H01L 21/6875 361/234 |
| 2018/0240690 | A1 * | 8/2018 | Chito | H01J 37/32715 |
| 2018/0281151 | A1 * | 10/2018 | Ramaswami | B24B 41/06 |

* cited by examiner

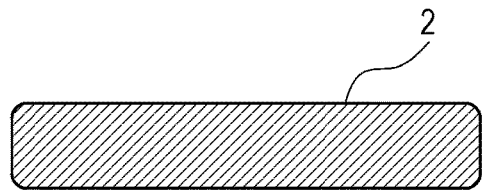
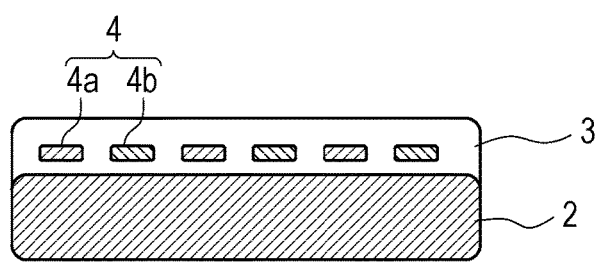
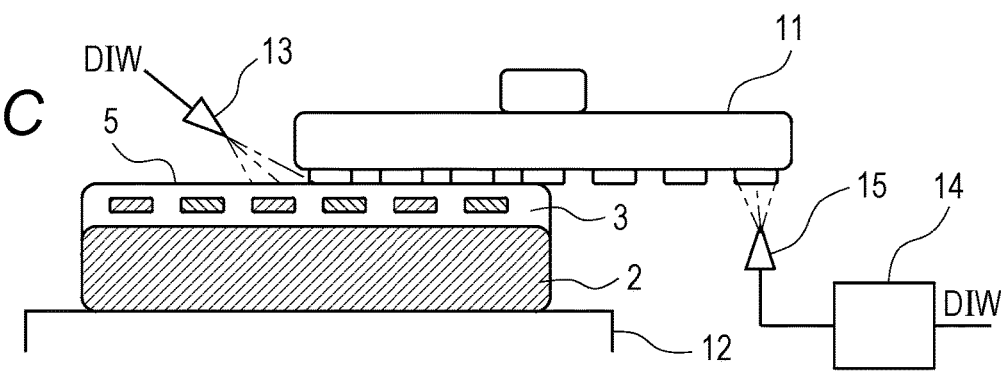
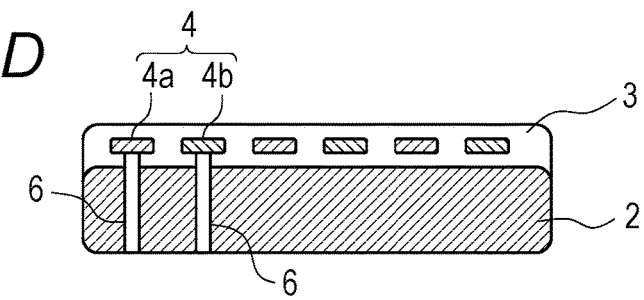
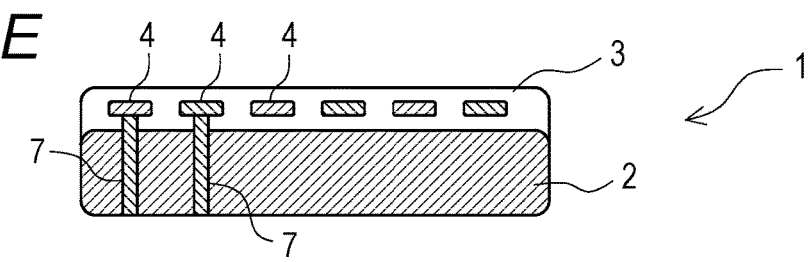

ELECTROSTATIC ATTACHMENT CHUCK, METHOD FOR MANUFACTURING THE SAME, AND SEMICONDUCTOR DEVICE MANUFACTURING METHOD

CROSS-REFERENCE TO RELATED APPLICATION

This application claims priority from Japanese Patent Application No. 2017-088042 filed with the Japan Patent Office on Apr. 27, 2017, the entire content of which is hereby incorporated by reference.

BACKGROUND

1. Technical Field

The present disclosure relates to an electrostatic attachment chuck, a method for manufacturing the same, and a semiconductor device manufacturing method.

2. Description of the Related Art

During a conventional process for thinning a semiconductor wafer, for example, a support wafer is joined to the semiconductor wafer via a resin. The support wafer serves to hold the semiconductor wafer. In this way, the risk of cracking of the semiconductor wafer during thinning, transfer and the like can be reduced.

Meanwhile, JP-A-2003-282671 discloses an electrostatic holding device which holds a semiconductor wafer using an electrostatic force (Coulomb force). The technique makes it possible to join a thin piece of item to be held, such as a semiconductor wafer, to the electrostatic holding device directly. By neutralizing electrodes and removing the electrostatic force, the item to be held can be easily released from the electrostatic holding device.

SUMMARY

An electrostatic attachment chuck includes: a substrate; a synthetic resin sheet joined to one main surface of the substrate; and at least a pair of electrodes disposed in the synthetic resin sheet. The synthetic resin sheet includes a planarized and ground surface serving as a surface on which a semiconductor wafer is abutted.

BRIEF DESCRIPTION OF THE DRAWINGS

FIG. 2A to FIG. 2E illustrate a method for manufacturing the electrostatic attachment chuck, where FIG. 2A illustrates a prepared substrate, FIG. 2B illustrates the substrate with a synthetic resin sheet joined thereto, FIG. 2C illustrates the synthetic resin sheet being ground, FIG. 2D illustrates holes formed in the substrate, and FIG. 2E illustrates electrical feeding electrodes formed in the substrate;

FIG. 3A illustrates a synthetic resin sheet before grinding, and FIG. 3B illustrates the synthetic resin sheet being ground; FIG. 4A illustrates an electrostatic attachment chuck attached to a semiconductor wafer, FIG. 4B illustrates a backside of semiconductor wafer being ground, FIG. 4C illustrates the semiconductor wafer being stacked and joined onto another semiconductor wafer, and FIG. 4D illustrates the electrostatic attachment chuck being detached from the semiconductor wafer.

DESCRIPTION OF THE EMBODIMENTS

Figure 1:
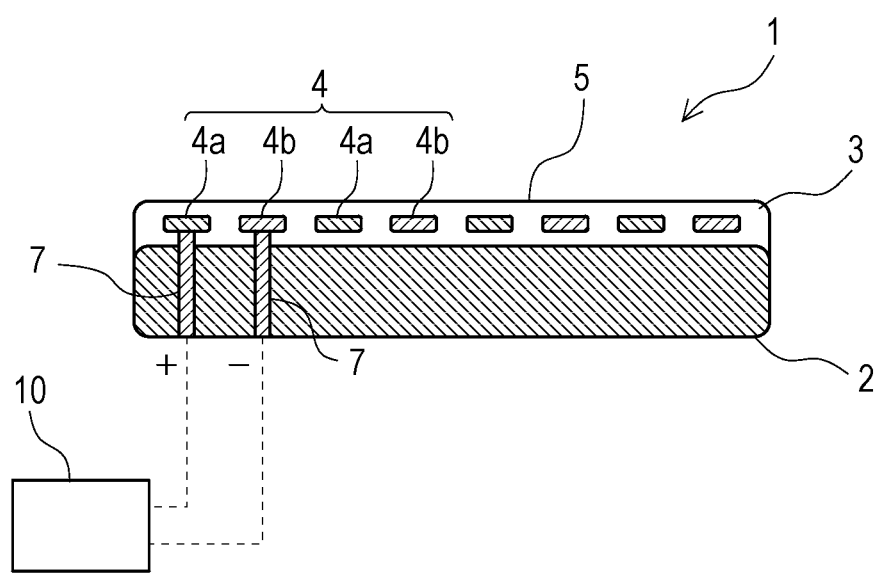
FIG. 1 is a cross sectional view illustrating a schematic configuration of an electrostatic attachment chuck according to an embodiment of the present disclosure.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In the field of semiconductor devices, larger sizes and three-dimensional implementations of semiconductor wafers are being increasingly adopted. In order to achieve higher integration of semiconductor devices, semiconductor wafers may be thinned and stacked so as to form a device having an increased number of layers.

Currently, the semiconductor wafer of each of three-dimensionally mounted layers has a thickness of from 40 to 50 μm. It is expected that there will be an increasing demand for thinning semiconductor wafers to thicknesses of 10 to 20 μm for more sophisticated multilayer implementations.

However, in order to achieve further thinning while preventing cracking and the like of the semiconductor wafer, the conventional technologies have been insufficient.

For example, according to one of the conventional techniques described above, the semiconductor wafer is held by a support wafer. In this method, the resin used for the bonding has large in-plane variations. Specifically, the resin used for the joining typically has a thickness of from 30 to 50 μm, where the in-plane variations are 2 to 3 μm. The variations are preserved as variations in the thickness of the semiconductor wafer during grinding for thinning. Accordingly, if the semiconductor wafer thickness is on the order of 10 μm, the thickness variations may have a large impact on device performance and yield.

In addition, in the method where the semiconductor wafer is held by a support wafer, the backside of the semiconductor wafer is ground or polished to thin the semiconductor wafer. The semiconductor wafer is subsequently released from the support wafer (resin). During the releasing, there is a risk of cracking of the semiconductor wafer.

In the electrostatic holding device disclosed in JP-A-2003-282671, the item to be held, such as a semiconductor wafer, is held by means of electrostatic force. As described above, the device allows the item to be held to be easily released by removing the electrostatic force. Accordingly, the risk of cracking of the semiconductor wafer as the item to be held during releasing can be reduced.

However, in the electrostatic holding device, due to the electrode material embedded in an insulator, waviness of 5 to 10 μm is created on the insulator surface. Accordingly, the process steps in which the electrostatic holding device can be used are limited to the steps of transfer, chemical vapor deposition (CVD), sputtering and the like. Thus, the electrostatic holding device is not readily utilizable as a holding device in the steps of micro-photolithography and grinding for thinning in order to form a backside reference.

In particular, when a semiconductor wafer is attached to the surface of an insulator having waviness in the electrostatic holding device, waviness of 5 to 10 μm is also generated in the surface of the semiconductor wafer. As a result, during photolithography, it becomes difficult to achieve good pattern formation due to the presence of portions on the surface of the semiconductor wafer that lie outside the focal depth.

In addition, when the electrostatic holding device is used for grinding for thinning of a semiconductor wafer, final thickness variations of 5 to 10 µm may arise in the semiconductor wafer due to the waviness produced in the surface of the electrostatic holding device. This may lead to product defects, characteristics variations and the like.

An objective of the present disclosure is to provide an electrostatic attachment chuck, a method for manufacturing the same, and a semiconductor device manufacturing method with which a semiconductor wafer can be easily released, thereby preventing cracking in the semiconductor wafer, and which makes it possible to finish a semiconductor wafer to high accuracy, thereby achieving thinning of the semiconductor wafer.

An electrostatic attachment chuck (the electrostatic attachment chuck) according to an aspect of the present disclosure includes: a substrate; a synthetic resin sheet joined to one main surface of the substrate; and at least a pair of electrodes disposed in the synthetic resin sheet. The synthetic resin sheet includes a planarized and ground surface serving as a surface on which a semiconductor wafer is abutted.

A method for manufacturing an electrostatic attachment chuck (the method for manufacturing an electrostatic attachment chuck) according to an aspect of the present disclosure includes: joining a synthetic resin sheet including at least a pair of electrodes to a substrate; and forming a planarized and ground surface on the synthetic resin sheet by grinding, with a grinding wheel, a surface of the synthetic resin sheet joined to the substrate.

A semiconductor device manufacturing method according to another aspect of the present disclosure includes: abutting a device surface of a semiconductor wafer on the planarized and ground surface of the electrostatic attachment chuck; holding the semiconductor wafer with an electrostatic force by applying a voltage to the electrodes; and grinding a backside of the semiconductor wafer being held on the electrostatic attachment chuck.

The electrostatic attachment chuck includes a substrate, a synthetic resin sheet joined to one main surface of the substrate, and at least a pair of electrodes disposed in the synthetic resin sheet.

Thus, with the electrostatic attachment chuck, it is possible to attach and hold a semiconductor wafer by applying a voltage to the pair of electrodes. In addition, with the electrostatic attachment chuck, it is possible to release the semiconductor wafer from the electrostatic attachment chuck easily by removing the voltage applied to the electrodes. Accordingly, damage to the semiconductor wafer when being released can be prevented.

The synthetic resin sheet includes the planarized and ground surface serving as a surface on which the semiconductor wafer is abutted. In this way, the electrostatic attachment chuck can be used in photolithography and thinning grinding steps involving the use of a holding surface having a high degree of flatness. Because the electrostatic attachment chuck includes the planarized and ground surface serving as a holding surface, it is possible, during a thinning grinding process using the electrostatic attachment chuck, to finish the semiconductor wafer with a uniform thickness, and to make the semiconductor wafer thinner.

The ground surface of the electrostatic attachment chuck may have a total thickness variation (TTV) of not more than 1 µm, TTV indicating the degree of flatness of the ground surface as a whole. Further, the ground surface may have a local thickness variation (LTV) of not more than 0.1 µm, LTV indicating the degree of flatness of an evaluation area measuring 25 mm×25 mm. In this way, the range of application of the electrostatic attachment chuck is greatly increased. As a result, the electrostatic attachment chuck can contribute to miniaturization, increased performance, ultra-thinning, and multilayering of the semiconductor wafer.

As noted above, the electrostatic attachment chuck may be applied for photolithography. In this case, by implementing a one-shot entire-surface exposure of the semiconductor wafer using the electrostatic attachment chuck, it becomes possible to form 1 µm lines and spaces or holes. Further, by implementing chip exposure in a stepper using the electrostatic attachment chuck, it becomes possible to form 0.1 µm lines and spaces or holes. Thus, with the electrostatic attachment chuck, high-accuracy microfabrication can be achieved.

When the electrostatic attachment chuck is applied for grinding for thinning of a semiconductor wafer, because the electrostatic attachment chuck has a high TTV, an improvement in device-to-device characteristic stability and a significant decrease in the thinning limit can be expected.

In particular, according to a conventional technology, the support wafer is bonded to the semiconductor wafer via resin. On the other hand, the electrostatic attachment chuck makes it possible to reduce the TTV, indicating the irregularities of a device surface of the semiconductor wafer, to one-third or less that of the conventional technology, or not more than 1 µm. In addition, the electrostatic attachment chuck makes it possible to reduce the LTV of the semiconductor wafer to one-tenth or less that of the conventional technology, or not more than 0.1 µm. In the case of the electrostatic chuck, the release stress upon releasing the semiconductor wafer from the electrostatic attachment chuck is small. Accordingly, in the step of ultra-thinning the semiconductor wafer to thicknesses of from 10 to 20 µm, a significant improvement in yield can be expected.

Thus, the electrostatic chuck has a relatively flat ground surface serving as a holding surface. Accordingly, it becomes possible to implement various processes using the electrostatic attachment chuck.

The method for manufacturing an electrostatic attachment chuck includes joining a synthetic resin sheet including at least a pair of electrodes to a substrate, and forming a planarized and ground surface on the synthetic resin sheet by grinding a surface of the synthetic resin sheet joined to the substrate, using a grinding wheel. In this way, the semiconductor wafer can be easily released, and an electrostatic attachment chuck can be obtained that has a ground surface with a high degree of flatness which is preferable as a holding surface.

In the method for manufacturing an electrostatic attachment chuck, the forming the ground surface may include the use of a diamond grinding wheel with a grit size in a range of from #500 to 8000. In this way, it becomes possible to grind the synthetic resin sheet covering the electrodes with high efficiency and high accuracy. As a result, a flat ground surface which is highly accurate and suitable for holding a semiconductor wafer can be obtained.

In the method for manufacturing an electrostatic attachment chuck, the forming the ground surface may include spraying a cleaning fluid onto a cutting edge of the grinding wheel that is not being subjected to the grinding process, with an ejection pressure of 3 to 20 MPa. In this way, it becomes possible to grind the synthetic resin sheet while removing, with the cleaning fluid, the cutting scrap of the synthetic resin sheet that adhered to the cutting edges of the grinding wheel. Thus, the surface of the synthetic resin sheet can be ground with high accuracy and easily. As a result, it becomes possible to form a ground surface having a high degree of flatness. In particular, the jet pressure of the cleaning fluid is important. By setting the ejection pressure in the preferable range, the cutting scrap of the synthetic resin sheet that adhered to the cutting edges of the grinding wheel can be removed satisfactorily.

The semiconductor device manufacturing method according to the other embodiment of the present disclosure includes abutting a device surface of the semiconductor wafer on the planarized and ground surface of the electrostatic attachment chuck, holding the semiconductor wafer using an electrostatic force by applying a voltage to the electrodes, and grinding the backside of the semiconductor wafer being held onto the electrostatic attachment chuck. In this way, it becomes possible to achieve a highly accurate uniform thickness of the semiconductor wafer with the ground backside. As a result, it becomes possible to manufacture a high-quality, ultra-thinned semiconductor wafer having a thickness of from 10 to 20 μm with a high yield.

In the following, an electrostatic attachment chuck according to an embodiment of the present disclosure, a method for manufacturing the same, and a semiconductor device manufacturing method using the electrostatic attachment chuck will be described with reference to the drawings.

FIG. 1 is a cross sectional view schematically illustrating a configuration of an electrostatic attachment chuck 1 according to the present embodiment. Referring to FIG. 1, the electrostatic attachment chuck 1 holds a semiconductor wafer 20 (see FIG. 4A to FIG. 4D) by means of electrostatic force. The electrostatic attachment chuck 1 is used as a support wafer during, e.g., a thinning process for the semiconductor wafer 20, a re-wiring process after thinning, or transfer. That is, the electrostatic attachment chuck 1 holds the semiconductor wafer 20 to reduce the risk of cracking in the semiconductor wafer 20.

The electrostatic attachment chuck 1 includes a substrate 2, a synthetic resin sheet 3, and at least a pair of electrodes 4. The synthetic resin sheet 3 is joined to one main surface of the substrate 2. The electrodes 4 are disposed in the synthetic resin sheet 3.

The substrate 2 is a high-rigidity, substantially circular plate member, such as a silicon substrate. The substrate 2 has surfaces that are planarized by grinding or polishing. The synthetic resin sheet 3 is joined to one of the planarized surfaces of the substrate 2.

The synthetic resin sheet 3 is a dielectric sheet member made of synthetic resin, and is substantially disc-shaped. The material of the synthetic resin sheet 3 may include various synthetic resins. From the viewpoint of strength, insulation, heat resistance, and thermal expansion and the like, the material of the synthetic resin sheet 3 is preferably a polyimide-based resin. When the synthetic resin sheet 3 is formed of highly heat-resistant polyimide-based resin, it becomes possible to use the electrostatic attachment chuck 1 at high temperature of 200° C. or above. For example, the electrostatic attachment chuck 1 including polyimide-based resin is useful in relatively high-temperature processes, such as photolithography and CVD film formation.

In the synthetic resin sheet 3, the electrodes 4 are disposed across substantially the entire surface of the synthetic resin sheet 3. The material of the electrodes 4 is a metal, such as copper and aluminum. The electrodes 4 include at least a pair of electrodes 4a and 4b. That is, in the synthetic resin sheet 3, one or more pairs of electrodes 4a and 4b are covered with the synthetic resin and insulated from each other. Each of the electrodes 4a and 4b is arranged continuously in a unicursal fashion across substantially the entire surface of the synthetic resin sheet 3.

The electrostatic attachment chuck 1 also includes electrical feeding electrodes 7 for electrical feeding of the electrodes 4. The material of the electrical feeding electrodes 7 is a metal, such as copper and aluminum. The electrical feeding electrodes 7 are connected to the electrodes 4 through the substrate 2 from outside the electrostatic attachment chuck 1.

As an electrical feeding device 10 applies a voltage between the electrodes 4a and 4b, the synthetic resin sheet 3 creates an electrostatic force for attaching and holding the semiconductor wafer 20. By removing the voltage applied between the electrodes 4 (between the electrodes 4a and 4b), the semiconductor wafer 20 can be easily released from the synthetic resin sheet 3. Accordingly, damage to the semiconductor wafer 20 during releasing can be prevented.

The electrostatic attachment chuck 1 is a self-holding type electrostatic attachment device. Specifically, the electrostatic attachment chuck 1, once electrically fed by the electrical feeding device 10, is capable of maintaining its electrostatic force even when separated from the electrical feeding device 10 and electrical feeding is terminated. The electrostatic attachment chuck 1 can maintain its attaching force for a long time even when disconnected from the electrical feeding device 10 after the semiconductor wafer 20 is bonded to the synthetic resin sheet 3 by the electrostatic force. For example, the electrostatic attachment chuck 1 can hold the semiconductor wafer 20 for several days after the electrical feeding is stopped.

Because the electrostatic attachment chuck 1 is of self-holding type, it becomes easier to handle the electrostatic attachment chuck 1 with the semiconductor wafer 20 bonded thereto. Accordingly, the electrostatic attachment chuck 1 of self-holding type may be preferably used, e.g., in a grinding step for thinning the semiconductor wafer 20 performed on a table 22 being rotated at high speed (see FIG. 4B). That is, there is no need for the electrostatic attachment chuck 1 to be connected to the electrical feeding device 10 at all times. Thus, there is no need to provide a semiconductor grinding device with wiring and connectors and the like for rotational connection for electrical feeding from the electrical feeding device 10 to the electrostatic attachment chuck 1. The self-holding type electrostatic attachment chuck 1 also reduces the likelihood of problems encountered in constantly energized-type electrostatic attachment devices, such as the problem where the semiconductor wafer 20 becomes detached from the electrostatic attachment chuck and jumps out of the semiconductor grinding device upon termination of electrical feeding to the electrodes 4 of the electrostatic attachment chuck rotating with the table 22.

As described above, the electrostatic attachment chuck 1 is preferably of self-holding type. The electrostatic attachment chuck 1, however, may be a constantly energized-type electrostatic attachment device. A constantly energized-type electrostatic attachment device would be constantly supplied with electricity from the electrical feeding device 10 in order to create electrostatic force.

On the surface on the opposite side of the synthetic resin sheet 3 from the surface to which the substrate 2 is joined, a planarized and ground surface (holding surface) 5 is formed. On the ground surface 5, the semiconductor wafer 20 is abutted. Thus, the electrostatic attachment chuck 1 can be used in photolithography and thinning grinding steps involving the use of a holding surface having a high degree of flatness. Because the electrostatic attachment chuck 1 has the planarized and ground surface 5 as a holding surface, by the thinning grinding according to the present embodiment, the semiconductor wafer 20 can be finished to a uniform thickness, and the semiconductor wafer 20 can be made thinner.

Specifically, the ground surface 5 has a total thickness variation (TTV) of not more than 1 TTV indicating the degree of flatness of the ground surface 5 as a whole. The ground surface 5 has a local thickness variation (LTV) of not more than 0.1 µm, LTV indicating the degree of flatness of an evaluation area measuring 25 mm×25 mm, which is the same size as a chip formed on the semiconductor wafer 20. Thus, the electrostatic attachment chuck 1 has a greatly increased range of application. Accordingly, the electrostatic attachment chuck 1 contributes to the miniaturization, increased performance, ultra-thinning, and multilayering of the semiconductor wafer 20.

As described above, the electrostatic attachment chuck 1 can be applied for photolithography, for example. In this case, the electrostatic attachment chuck 1 may be used to implement one-shot entire-surface exposure of the semiconductor wafer 20 in order to form 1 µm lines and spaces or holes. The electrostatic attachment chuck 1 may also be used to implement chip exposure using a stepper in order to form 0.1 µm lines and spaces or holes. Thus, the electrostatic attachment chuck 1 makes it possible to perform high-accuracy microfabrication.

When the electrostatic attachment chuck 1 is applied for the grinding for thinning of the semiconductor wafer 20, because the electrostatic attachment chuck 1 has high TTV, an improvement in device-to-device characteristic stability and a significant decrease in the thinning limit can be expected.

In particular, according to a conventional technology, the support wafer is bonded to the semiconductor wafer 20 via resin. On the other hand, in the electrostatic attachment chuck 1, the TTV indicating the irregularities of the device surface of the semiconductor wafer 20 can be reduced to one-third or less that of the conventional technology, or to not more than 1 µm. In addition, in the electrostatic attachment chuck 1, the LTV of the semiconductor wafer 20 can be reduced to one-tenth or less that of the conventional technology, or to not more than 0.1 µm.

With the electrostatic attachment chuck 1, with respect to the thinning of the semiconductor wafer 20, it becomes possible to achieve a significant improvement in the uniformity of the thickness of the semiconductor wafer 20, and to facilitate the thinning of the semiconductor wafer 20. Accordingly, the electrostatic attachment chuck 1 can be applied for the manufacture of a three-dimensional integrated circuit, and can further contribute to ultra-multilayering.

Further, in the electrostatic attachment chuck 1, the release stress at the time of releasing the semiconductor wafer 20 from the electrostatic attachment chuck 1 is relatively small. Accordingly, in the step of ultra-thinning the semiconductor wafer 20 to thicknesses of from 10 to 20 µm, a significant improvement in yield can be expected.

In addition, with the electrostatic attachment chuck 1, it becomes possible to perform fine pattern formation on the semiconductor wafer 20 that has been thinned. This makes it possible, in particular, to achieve an improvement in the accuracy of through-silicon via (TSV) fabrication in the backside TSV step during a via-last process, and to achieve miniaturization during electrode formation and re-wiring. Thus, an application of the electrostatic attachment chuck 1 to the manufacture of a three-dimensional integrated circuit contributes to increasing device performance and integration.

Using the electrostatic attachment chuck 1, which includes the relatively flat ground surface 5 as the holding surface, various processes for the manufacture of semiconductor devices can be implemented.

With reference to FIG. 2A to FIG. 2E, FIG. 3A, and FIG. 3B, a method for manufacturing the electrostatic attachment chuck 1 will be described in detail.

FIG. 2A to FIG. 2E illustrate the method for manufacturing the electrostatic attachment chuck 1. FIG. 2A illustrates a prepared substrate 2. FIG. 2B illustrates the substrate 2 with the synthetic resin sheet 3 joined thereto. FIG. 2C illustrates the synthetic resin sheet 3 being ground. FIG. 2D illustrates holes 6 formed in the substrate 2. FIG. 2E illustrates the electrical feeding electrodes 7 formed in the substrate 2.

Figure 3A:
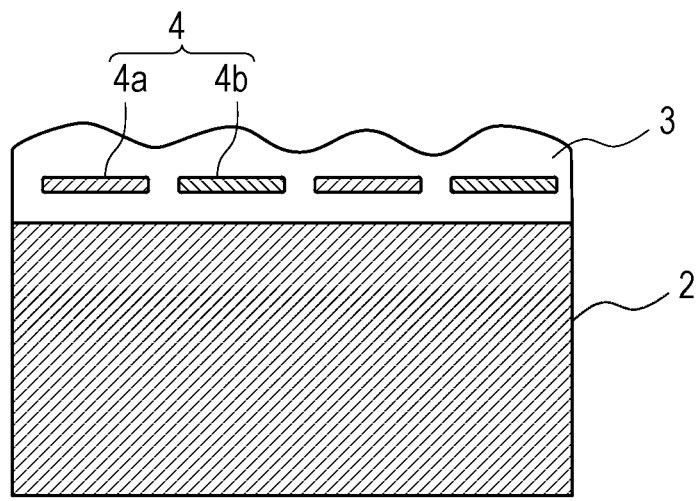
FIG. 3A and FIG. 3B illustrate a method for manufacturing the electrostatic attachment chuck, where
Figure 3B:
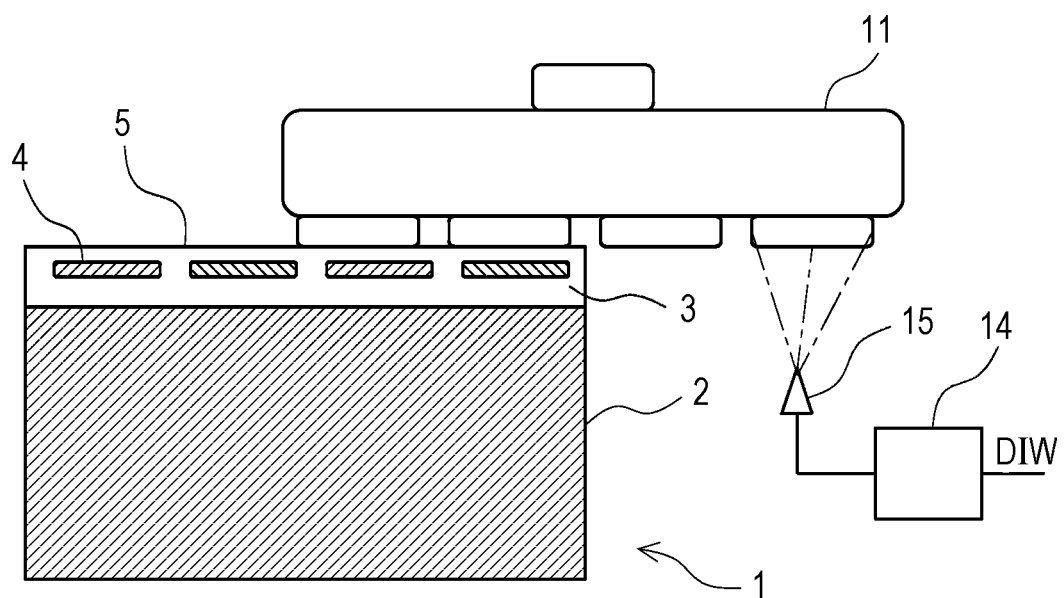

FIG. 3A and FIG. 3B illustrate the method for manufacturing the electrostatic attachment chuck 1. FIG. 3A illustrates the synthetic resin sheet 3 before grinding. FIG. 3B illustrates the synthetic resin sheet 3 being ground.

First, as illustrated in FIG. 2A, the substantially disc-shaped, high-rigidity substrate 2 having the surface planarized by grinding or polishing is prepared. The substrate 2 is mounted on a table, for example, which is not illustrated.

Then, as illustrated in FIG. 2B, on the upper surface of the substrate 2, the synthetic resin sheet 3 with the electrodes 4 disposed therein is stacked. The substrate 2 and the synthetic resin sheet 3 are then joined together and integrated by thermal compression bonding, for example.

In the state in which the synthetic resin sheet 3 is bonded to the main surface of the substrate 2, substantially the entire surface of the synthetic resin sheet 3 has a surface waviness (irregularities) on the order of 5 to 10 µm, as illustrated in FIG. 3A. Also, the surface of the synthetic resin sheet 3 has irregularities of 3 to 5 µm corresponding to the presence or absence of the electrodes 4.

Thus, as illustrated in FIG. 2C and FIG. 3B, the step for forming a substantially flat ground surface 5 by grinding the surface of the synthetic resin sheet 3 is performed. In the step of forming the ground surface 5, as illustrated in FIG. 2C, the integrally joined substrate 2 and synthetic resin sheet 3 are mounted and held on a table 12 of a grinding device with the synthetic resin sheet 3 at the top. The table 12 is a vacuum chuck table including a porous ceramic, for example. The substrate 2 is held onto the table 12 by vacuum suction force.

The upper surface of the synthetic resin sheet 3 is ground using a grinding wheel 11. In this way, the irregularities illustrated in FIG. 3A are removed from the upper surface of the synthetic resin sheet 3. The upper surface of the synthetic resin sheet 3 is planarized as illustrated in FIG. 3B. In this way, a ground surface 5 having a high degree of flatness is formed.

As the grinding wheel 11, a diamond-based or ceramic-based grinding wheel may be used. The grinding wheel 11 may preferably have a grit size in a range of from #500 to #8000, more preferably in a range of from #3000 to #5000, and most preferably of #4000. In the present embodiment, as the grinding wheel 11, a grinding wheel is adopted which is obtained by solidifying polycrystalline diamond with a grit size #4000 with vitrified bond. In this way, excellent processability is obtained. Because the grinding wheel 11 has a preferable surface roughness, the ground surface 5 having a high degree of flatness can be obtained.

As a preferable process condition for obtaining an excellent degree of flatness, the grinding wheel 11 has a feed speed of preferably in a range of from 10 to 30 µm/min, and more preferably 20 µm/min. The grinding wheel 11 has a cutting amount preferably in a range of from 2 to 3 times the maximum value of the waviness of the surface of the synthetic resin sheet 3. The grinding wheel 11 has a rotating speed preferably in a range of from 1000 to 2000 $min^{-1}$, and more preferably 1450 $min^{-1}$. The substrate 2 has a rotating speed preferably in a range of from 200 to 400 $min^{-1}$, and more preferably 299 $min^{-1}$.

The surface of the synthetic resin sheet 3 being subjected to the grinding process is supplied with a cleaning fluid from a grinding fluid supply device, not illustrated, of the grinding device, via a grinding fluid supply nozzle 13. As the grinding fluid, purified water is used, for example.

The above grinding conditions are preferable grinding conditions. However, in some cases, it may be difficult to perform high-accuracy grinding of the synthetic resin sheet 3 by the above-described grinding method alone. Thus, in the method for manufacturing the electrostatic attachment chuck 1 according to the present embodiment, the grinding method may further include spraying a high-pressure cleaning fluid onto the cutting edges of the grinding wheel 11 that are not being subjected to the grinding process. More specifically, as illustrated in FIG. 2C, a pressurized cleaning fluid, such as purified water, is ejected toward the cutting edges of the grinding wheel 11 from a cleaning fluid supply device 14 of the grinding device via a cleaning fluid supply nozzle 15.

In this case, the pressure and jet angle of the cleaning fluid sprayed onto the grinding wheel 11, and the distance from the cleaning fluid supply nozzle 15 to the cutting edges of the grinding wheel 11 are important. When these are preferably set and the above-described preferable grinding conditions are adopted, it becomes possible to grind the synthetic resin sheet 3 while removing, with the cleaning fluid, the cutting scrap of the synthetic resin sheet 3 that adhered to the cutting edges of the grinding wheel 11. In this way, it becomes possible to grind the surface of the synthetic resin sheet 3 with high accuracy and easily. As a result, it becomes possible to form the ground surface 5 having a high degree of flatness.

In particular, the cleaning fluid may have an ejection pressure in a range of from 3 to 20 MPa, and is preferably in a range of from 6 to 8 MPa. The cleaning fluid has a jet angle preferably in a range of from 5 to 20 degrees, and more preferably in a range of from 8 to 12 degrees. The distance from the cleaning fluid supply nozzle 15 to the cutting edges of the grinding wheel 11 may be in a range of from 10 to 30 mm, and is preferably in a range of from 15 to 25 mm and more preferably 20 mm.

After the step of forming the ground surface 5 is performed, a plurality of holes 6 for forming the electrical feeding electrodes 7 (see FIG. 2E) is formed in the substrate 2, as illustrated in FIG. 2D. The holes 6 are formed from the backside of the substrate 2, i.e., the main surface of the substrate 2 to which the synthetic resin sheet 3 is not joined, so as to reach the electrodes 4.

In particular, the portions of the holes 6 that penetrate through the substrate 2 are formed by means of YAG laser, for example. Thereafter, $CO_2$ laser or the like is used to form the portions of the holes 6 passing through the synthetic resin sheet 3. In this way, the electrodes 4 are exposed where the holes 6 are formed in the synthetic resin sheet 3. Thus, the portions of the holes 6 in the synthetic resin sheet 3 are processed using $CO_2$ laser. $CO_2$ laser does not readily process metals. Accordingly, the processing can be advantageously automatically stopped when the holes 6 reach the electrodes 4.

Then, as illustrated in FIG. 2E, a step of forming the electrical feeding electrodes 7 by embedding a metal in the obtained holes 6 is performed. The electrical feeding electrodes 7 are embedded in the holes 6 by inkjetting, printing, or plating.

Through the above steps, the electrostatic attachment chuck 1 is obtained that includes the ground surface 5 having a high degree of flatness as the holding surface for holding the semiconductor wafer 20 (see FIG. 4A to FIG. 4D).

With reference to FIG. 4A to FIG. 4D, a semiconductor device manufacturing method using the electrostatic attachment chuck 1 will be described in detail.

Figure 4A:
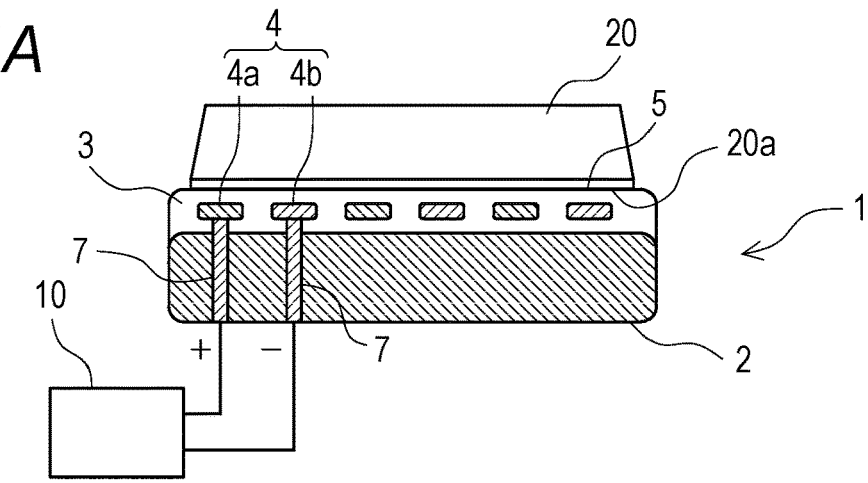
FIG. 4A to FIG. 4D illustrate a method for manufacturing the semiconductor device, where
Figure 4B:
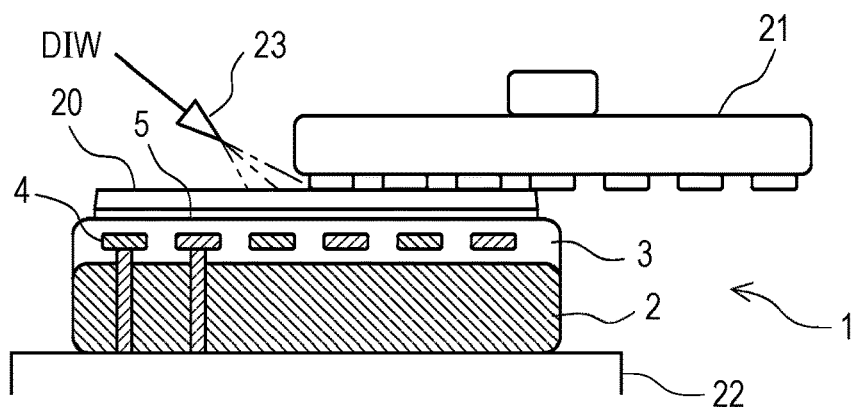
Figure 4C:
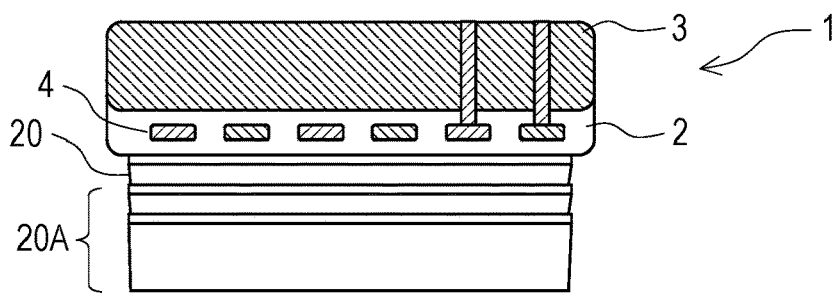
Figure 4D:
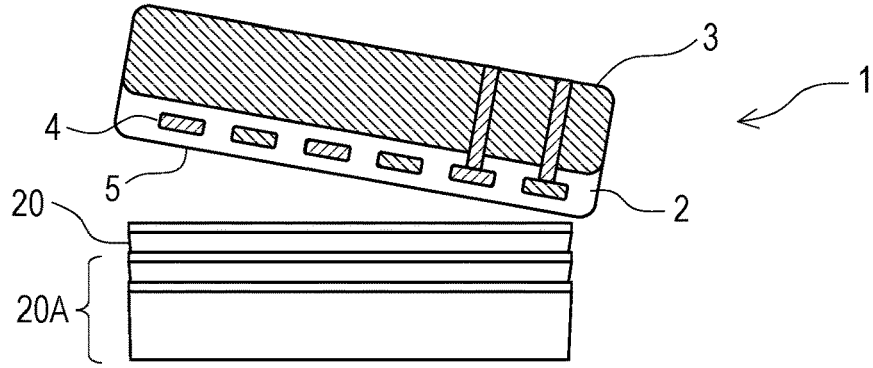

FIG. 4A to FIG. 4D illustrate the semiconductor device manufacturing method using the electrostatic attachment chuck 1. FIG. 4A illustrates the electrostatic attachment chuck 1 mounted to the semiconductor wafer 20. FIG. 4B illustrates the backside of the semiconductor wafer 20 being ground. FIG. 4C illustrates the semiconductor wafer being stacked and joined onto another semiconductor wafer 20. FIG. 4D illustrates the electrostatic attachment chuck 1 being detached from the semiconductor wafer 20.

As illustrated in FIG. 4A to FIG. 4D, the electrostatic attachment chuck 1 is utilized as a support wafer for holding the semiconductor wafer 20 during a thinning process and a stacking process for the semiconductor wafer 20.

In particular, initially, a circuit is formed on the surface of the semiconductor wafer 20, which may include silicon and the like, by conventional method. The semiconductor wafer 20 may have through-electrodes formed therein. The inclined or rounded portions and the like of the peripheries of the semiconductor wafer 20 may be removed by edge trimming.

As illustrated in FIG. 4A, on the planarized and ground surface 5 of the electrostatic attachment chuck 1, the semiconductor wafer 20 is mounted with a device surface 20a having the circuit formed thereon facing downward.

Then, to the pair of electrodes 4a and 4b, a positive potential (+) and a negative potential (−), respectively, are applied from the electrical feeding device 10. The application of voltage to the electrodes 4 (electrodes 4a and 4b) produces an electrostatic force that bonds the semiconductor wafer 20 and the electrostatic attachment chuck 1 together.

For example, the electrical feeding device 10 applies a voltage of +500 V to the electrodes 4a, and a voltage of −500 V to the electrodes 4b. By holding the state of voltage application for 30 seconds, the semiconductor wafer 20 and the electrostatic attachment chuck 1 are joined with an attaching force of 50 kPa or more. In this way, the bonding of the semiconductor wafer 20 and the electrostatic attachment chuck 1 is completed.

As described above, the electrostatic attachment chuck 1 is of self-holding type. Thus, after the electrical feeding is performed, even when the electrical feeding from the electrical feeding device 10 is stopped and the electrical feeding device 10 is separated from the electrostatic attachment chuck 1, the attaching force between the semiconductor wafer 20 and the electrostatic attachment chuck 1 is maintained.

The integrally joined semiconductor wafer 20 and electrostatic attachment chuck 1 are then detached from the electrical feeding device 10, and are, as illustrated in FIG. 4B, set on the table 22 of the grinding device. The table 22 is a plate member including a porous ceramic, for example.

The electrostatic attachment chuck 1 with the semiconductor wafer 20 joined thereto is held onto the table 22 by vacuum attachment.

The backside of the semiconductor wafer 20 is then ground or polished by the grinding device. In this way, the semiconductor wafer 20 is thinned. Specifically, the table 22 and the grinding wheel 21 are each rotated, whereby the cutting edges of the grinding wheel 21 abrasively slide on the backside of the semiconductor wafer 20. In this way, predetermined amounts of silicon and the through-electrodes are removed from the backside of the semiconductor wafer 20. During the grinding process, the backside of the semiconductor wafer 20 is supplied with a cleaning fluid, such as purified water, from a grinding fluid supply device, not illustrated, of the grinding device, via a grinding fluid supply nozzle 23.

As described above, the electrostatic attachment chuck 1 has the ground surface 5 which is planarized to high accuracy. By utilizing the electrostatic attachment chuck 1 as a support wafer, it becomes possible to obtain, under conventional grinding process conditions, the semiconductor wafer 20 which is thinned to high accuracy. That is, the highly accurately thinned semiconductor wafer 20 having TTV and LTV values substantially equivalent to those of the ground surface 5 of the electrostatic attachment chuck 1 is obtained.

During the process of thinning the semiconductor wafer 20, a high-pressure cleaning fluid may be sprayed onto the cutting edges of the grinding wheel 21 that are not being subjected to the grinding process. Specifically, a pressurized cleaning fluid, such as purified water, may be ejected from a cleaning fluid supply device, not illustrated, of the grinding device toward the cutting edges of the grinding wheel 21, via a cleaning fluid supply nozzle. In this way, it becomes possible to grind the semiconductor wafer 20 while removing, with the cleaning fluid, the cutting scrap of the semiconductor wafer 20 that adhered to the cutting edges of the grinding wheel 21. Thus, it becomes possible to grind the backside of the semiconductor wafer 20 with high accuracy and easily.

After the grinding of the backside of the semiconductor wafer 20 is completed, steps of exposing the heads of the through-electrodes and finishing the head faces may be performed, for example. Then, the thinned semiconductor wafer 20 is detached from the table 22 together with the electrostatic attachment chuck 1. Thereafter, as illustrated in FIG. 4C, the thinned semiconductor wafer 20 is inverted and stacked on a processed, another semiconductor wafer 20A, for example. The thinned semiconductor wafer 20 is held onto the electrostatic attachment chuck 1. Accordingly, the risk of the semiconductor wafer 20 being damaged upon being detached from the table 22 or during a transfer and the like is small.

Then, the semiconductor wafer 20 stacked on the semiconductor wafer 20A and the semiconductor wafer 20A are joined by, e.g., normal temperature bonding by surface activation. That is, the backside of the thinned semiconductor wafer 20 is joined to the surface of the semiconductor wafer 20A that has previously been processed.

As illustrated in FIG. 4D, the electrodes 4 of the electrostatic attachment chuck 1 are neutralized, and the electrostatic attachment chuck 1 is detached from the semiconductor wafer 20. In this case, the electrostatic attachment chuck 1 can be easily detached without applying excessive load on the semiconductor wafer 20. Thus, the likelihood of damage to the semiconductor wafer 20, such as cracking and chipping, is reduced.

The process of thinning the semiconductor wafer 20 and the stacking process illustrated in FIG. 4A to FIG. 4D are repeated a predetermined number of times. Thereafter, various conventional post-processes are performed, whereby a highly densely stacked, high-quality semiconductor device is obtained.

The present disclosure is not limited to the embodiment, and various modifications may be made without departing from the scope thereof.

Embodiments of the present disclosure may include the following first and second electrostatic attachment chucks, first to third methods for manufacturing the electrostatic attachment chuck, and first semiconductor device manufacturing method.

The first electrostatic attachment chuck is an electrostatic attachment chuck for holding a semiconductor wafer using an electrostatic force, and includes a substrate, a synthetic resin sheet joined to one main surface of the substrate, and at least a pair of electrodes disposed in the synthetic resin sheet. The synthetic resin sheet includes a surface formed with a planarized and ground surface on which the semiconductor wafer is abutted.

The second electrostatic attachment chuck is the first electrostatic attachment chuck in which the ground surface has a TTV of not more than 1 μm, and an LTV of not more than 0.1 μm in an evaluation area measuring 25 mm×25 mm.

The first method for manufacturing the electrostatic attachment chuck is a method for manufacturing an electrostatic attachment chuck for holding a semiconductor wafer using an electrostatic force, and includes a step of joining a synthetic resin sheet including at least a pair of electrodes to a substrate, and a step of forming a planarized and ground surface by grinding a surface of the synthetic resin sheet joined to the substrate, using a grinding wheel.

The second method for manufacturing an electrostatic attachment chuck is the first method for manufacturing an electrostatic attachment chuck, in which the grinding wheel is a diamond grinding wheel with a grit size #500 to 8000, and the ground surface is planarized to a TTV of not more than 1 μm and a LTV of not more than 0.1 μm in an evaluation area measuring 25 mm×25 mm.

The third method for manufacturing an electrostatic attachment chuck is the first or second method for manufacturing an electrostatic attachment chuck, in which the step of forming the ground surface includes spraying a cleaning fluid onto a cutting edge of the grinding wheel that is not being subjected to the grinding process, with an ejection pressure of 3 to 20 MPa.

The first semiconductor device manufacturing method includes a step, using the first or second electrostatic attachment chuck, of holding a semiconductor wafer with an electrostatic force by applying a voltage to the electrodes, with a device surface of the semiconductor wafer being abutted on the planarized and ground surface of the electrostatic attachment chuck, and a step of grinding a backside of the semiconductor wafer being held on the electrostatic attachment chuck.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. An electrostatic attachment chuck comprising:
    a substrate;
    a synthetic resin sheet joined to one main surface of the substrate; and
    at least a pair of electrodes disposed in the synthetic resin sheet,
    wherein the synthetic resin sheet includes a planarized and ground surface serving as a surface on which a semiconductor wafer is abutted,
    the electrostatic attachment chuck is a self-holding electrostatic attachment chuck,
    the at least a pair of electrodes comprises a plurality pairs of electrodes including positive electrodes and negative electrodes, and
    the positive electrodes and negative electrodes are alternately arranged in the synthetic resin sheet.

2. The electrostatic attachment chuck according to claim 1, wherein the ground surface has a TTV of not more than 1 μm, and a LTV of not more than 0.1 μm in an evaluation area measuring 25 mm×25 mm.

3. A method for manufacturing an electrostatic attachment chuck, the method comprising:
    joining a synthetic resin sheet including at least a pair of electrodes to a substrate; and
    forming a planarized and ground surface on the synthetic resin sheet by grinding, with a grinding wheel, a surface of the synthetic resin sheet joined to the substrate, wherein
    the electrostatic attachment chuck is a self-holding electrostatic attachment chuck,
    the at least a pair of electrodes comprises a plurality pairs of electrodes including positive electrodes and negative electrodes, and
    the positive electrodes and negative electrodes are alternately arranged in the synthetic resin sheet.

4. The method for manufacturing an electrostatic attachment chuck according to claim 3, wherein:
    the grinding wheel is a diamond grinding wheel having a grit size in a range of from #500 to 8000; and
    the forming the ground surface includes forming the ground surface having a TTV of not more than 1 μm, and a LTV of not more than 0.1 μm in an evaluation area measuring 25 mm×25 mm.

5. The method for manufacturing an electrostatic attachment chuck according to claim 3, wherein the forming the ground surface includes spraying a cleaning fluid onto a cutting edge of the grinding wheel that is not being subjected to the grinding process, with an ejection pressure of 3 to 20 MPa.

6. A semiconductor device manufacturing method comprising:
    abutting a device surface of a semiconductor wafer on the planarized and ground surface of the electrostatic attachment chuck according to claim 1;
    holding the semiconductor wafer with an electrostatic force by applying a voltage to the electrodes; and
    grinding a backside of the semiconductor wafer being held on the electrostatic attachment chuck.

7. The electrostatic attachment chuck according to claim 1, wherein
    the self-holding electrostatic attachment chuck is capable of creating electrostatic force by receiving electrical feeding, and maintaining the electrostatic force even when the electrical feeding is terminated.

8. The method for manufacturing an electrostatic attachment chuck according to claim 3, wherein
    the self-holding electrostatic attachment chuck is capable of creating electrostatic force by receiving electrical feeding, and maintaining the electrostatic force even when the electrical feeding is terminated.

* * * * *